(12) United States Patent
Hsieh et al.

(10) Patent No.: US 9,725,824 B2
(45) Date of Patent: Aug. 8, 2017

(54) GRAPHITE WAFER CARRIER FOR LED EPITAXIAL WAFER PROCESSES

(71) Applicant: XIAMEN SANAN OPTOELECTRONICS TECHNOLOGY CO., LTD., Xiamen (CN)

(72) Inventors: Hsiang-Pin Hsieh, Xiamen (CN); Qi Nan, Xiamen (CN); Lei Pan, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/588,384

(22) Filed: Dec. 31, 2014

(65) Prior Publication Data
US 2015/0118009 A1    Apr. 30, 2015

Related U.S. Application Data

(63) Continuation of application No. PCT/CN2013/088264, filed on Dec. 2, 2013.

(30) Foreign Application Priority Data

Dec. 3, 2012 (CN) .......................... 2012 1 0506371

(51) Int. Cl.
| | | |
|---|---|---|
| H01L 21/687 | (2006.01) | |
| H01L 21/68 | (2006.01) | |
| C30B 25/12 | (2006.01) | |
| C23C 16/458 | (2006.01) | |
| B25J 11/00 | (2006.01) | |
| H01L 21/673 | (2006.01) | |

(52) U.S. Cl.
CPC ........... *C30B 25/12* (2013.01); *B25J 11/0095* (2013.01); *C23C 16/4583* (2013.01); *H01L 21/673* (2013.01); *H01L 21/6875* (2013.01); *H01L 21/68735* (2013.01); *H01L 21/68771* (2013.01)

(58) Field of Classification Search
None
See application file for complete search history.

(56) References Cited

U.S. PATENT DOCUMENTS

| | | | | |
|---|---|---|---|---|
| 2005/0183829 A1* | 8/2005 | Goodman | ........... | C23C 16/4581 156/345.51 |
| 2008/0110401 A1* | 5/2008 | Fujikawa | ............ | C23C 16/4583 118/724 |
| 2013/0276704 A1* | 10/2013 | Krishnan | ............ | C23C 16/4584 118/725 |

\* cited by examiner

*Primary Examiner* — Kavel Singh
(74) *Attorney, Agent, or Firm* — Syncoda LLC; Feng Ma; Junjie Feng

(57) ABSTRACT

A graphite wafer carrier for LED epitaxial wafer processes, having a plurality of wafer pocket profiles above the carrier for carrying the epitaxial wafer substrate. The inner edge of the wafer pocket profile is a concave step with a plurality of inward-extended support portions; and also has a graphite wafer carrier edge and an axle hole at the center of the graphite wafer carrier. The pocket profiles of different quantities and sizes can be arranged on the basis of different process parameters. The disclosed structure can reduce or eliminate airflow interference and improve the wafer edge yield.

20 Claims, 12 Drawing Sheets

GRAPHITE WAFER CARRIER FOR LED EPITAXIAL WAFER PROCESSES

CROSS-REFERENCE TO RELATED APPLICATIONS

The present application is a continuation of, and claims priority to, PCT/CN2013/088264, filed on Dec. 2, 2013, which claims priorities to Chinese Patent Application No. CN 201210506371.8, filed on Dec. 3, 2012. The disclosures of the above applications are hereby incorporated by reference in their entirety.

BACKGROUND

The light emitting diode (LED) is a solid-state semiconductor light-emitting device, which is widely used in lighting applications such as signage and displays.

Many LED epitaxial wafers are obtained from the metal-organic chemical vapor deposition (MOCVD) process, the process of which is described as follows: put the epitaxial wafer substrate (e.g., sapphire substrate) on the pocket profile of the graphite wafer carrier and transmit to the MOCVD reaction chamber together with the graphite wafer carrier.

The substrate, together with the graphite wafer carrier, is heated to about 1000° C. Input meta-organic compound and Group V gas in the reaction chamber. After high-temperature pyrolysis, rejoin the LED epitaxial layer on the wafer substrate.

In the LED epitaxial wafer process, the wafer substrate is directly carried on the graphite wafer carrier. Therefore, the graphite wafer carrier structure has an important influence on the epitaxy yield, which is a key point for industrial study.

SUMMARY

The present disclosure provides a graphite wafer carrier for LED epitaxial wafer processes. The LED epitaxial slice for growth has high overall yield and good wavelength uniformity.

The technical scheme of the present invention is a graphite wafer carrier for LED epitaxial wafer processes, comprising a plurality of wafer pocket profiles above the carrier for carrying the epitaxial wafer substrate, wherein, the inner edge of the wafer pocket profile is a concave step with a plurality of inward-extended support portions; and also comprises a graphite wafer carrier edge and an axle hole at the center of the graphite wafer carrier. The pocket profiles of different quantities and sizes can be arranged on the basis of different process parameters.

Further, during epitaxial growth, the inner edge structure of the wafer pocket profile can eliminate airflow interference and improve the wafer edge yield.

Preferably, the relationship between the wafer substrate diameter D1 and the step inner diameter D2 is: 0≤D1−D2<0.06 mm.

Preferably, the step width of the inner edge of the wafer pocket profile is 0.02 mm-1.5 mm and the height is 0.03 mm-0.5 mm.

Preferably, the step width of the inner edge of the wafer pocket profile is 0.2 mm-0.5 mm mm and the height is 0.03 mm-0.5 mm. Preferably, the support portion of the inner edge of the wafer pocket profile is a periodically-distributed protrusion.

Preferably, the protrusion width is 0.2 mm-0.5 mm and the height is 0.03 mm-0.5 mm.

Preferably, the step height of the wafer pocket profile edge is same with the protrusion height.

Preferably, the wafer pocket profile bottom is a flat surface, a convex surface or a concave surface.

The graphite wafer carrier disclosed in the present invention has a wafer pocket profile comprising a step-shaped and inward-extended support portion edge, which can directly carry the epitaxial wafer substrate to transfer direct contact between the epitaxial wafer substrate and the graphite wafer carrier into indirect contact, thus transferring the original contact heating of the epitaxial slice into thermal radiant heating, which effectively improves uneven heating of the epitaxial slice, poor wavelength evenness and low entire yield due to the graphite wafer carrier quality and surface condition; which also effectively avoids such defects as hollow from carrying the wafer bottom and enlarged wrapping of the epitaxial wafer substrate due to turbulent flow resulted from injection of airflow in the reaction chamber into the bottom of the wafer substrate.

A graphite wafer carrier for LED epitaxial wafer processes, which is applicable to MOCVD method in the LED epitaxy process.

1: wafer pocket profile on the graphite wafer carrier; 2: graphite wafer carrier edge; 3: axle hole at the center of the graphite wafer carrier; 4: inner edge of the wafer pocket profile (indentation) of the flat carrier; 5: bottom surface of the wafer pocket profile of the flat carrier; 6: inner edge of the wafer pocket profile of the rim carrier; 7: step-shaped edge of the rim carrier; 8: bottom of the wafer pocket profile of the rim carrier; 9: inner edge of the wafer pocket profile of the tab carrier; 10: protrusion-shaped edge of the tab carrier; 11: wafer pocket profile bottom of the tab carrier; 12: inner edge of the wafer pocket profile with the step-shaped and protrusion-shaped edge; 13: step of the wafer pocket profile with the step-shaped and protrusion-shaped edge; 14: protrusion of the wafer pocket profile with the step-shaped and protrusion-shaped edge; 15: concave bottom of the wafer pocket profile with the step-shaped and protrusion-shaped edge; 16: epitaxial wafer substrate; 17: airflow flowing through the wafer substrate and the wafer pocket profile in the reaction chamber; 18: space between the wafer substrate and the wafer pocket profile; 19: flat surface bottom of the wafer pocket profile with the step-shaped and protrusion-shaped edge; 20: convex bottom of the wafer pocket profile with the step-shaped and protrusion-shaped edge.

DETAILED DESCRIPTION

Figure 1:
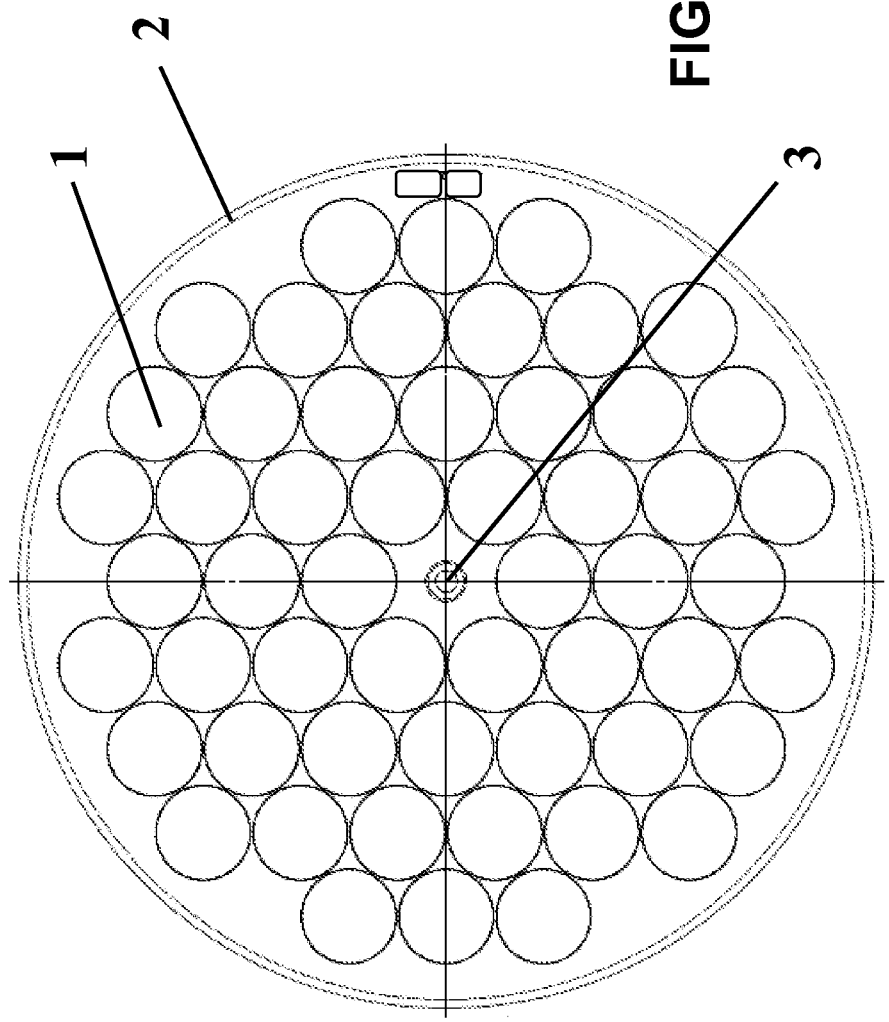
FIG. 1 is a section view of a graphite wafer carrier for LED epitaxy.

FIG. 1 is a section view of a typical graphite wafer carrier for LED epitaxy. A plurality of wafer pocket profiles (indentations) 1 at a top surface the carrier are configured to carry the epitaxial wafer substrate. The wafer pocket profile 1 of the LED graphite wafer carriers can have different designs, such as a flat carrier, a step-shaped rim carrier (the rim carrier), and a protrusion-shaped rim carrier (the tab carrier).

Figure 2:
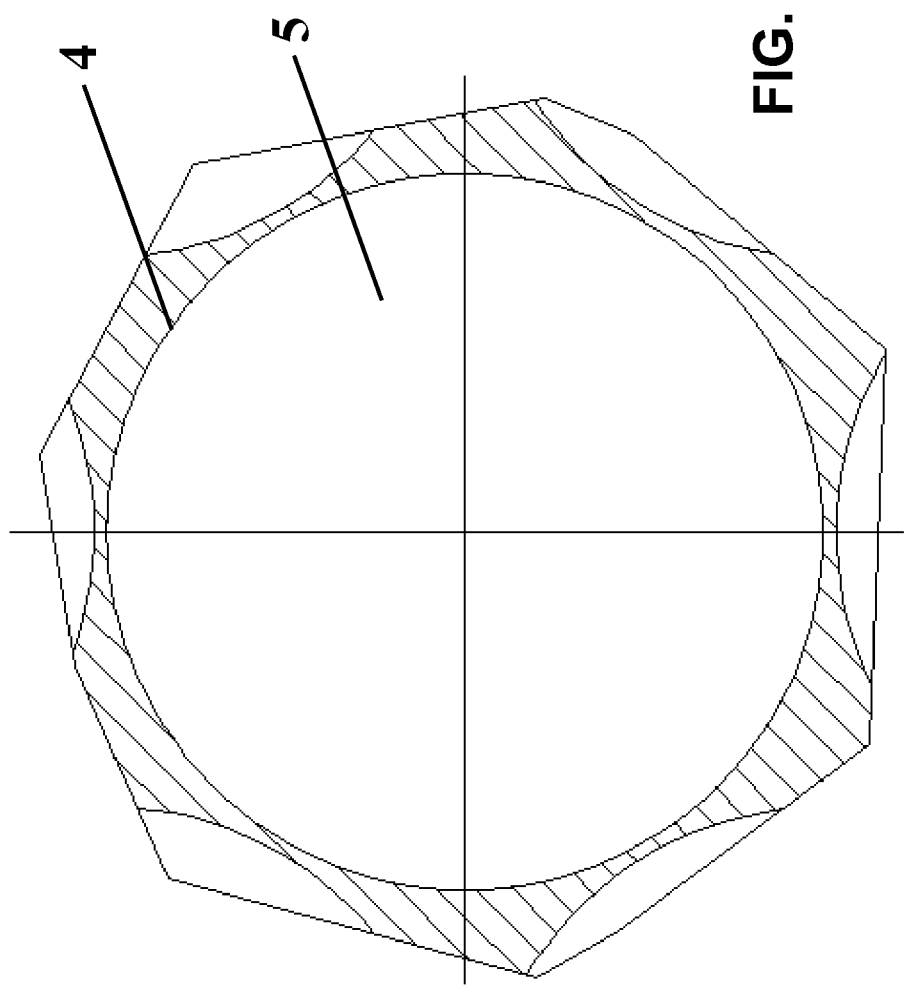
FIG. 2 is a section view of a wafer pocket profile of the flat carrier of the graphite wafer carrier.
Figure 3:
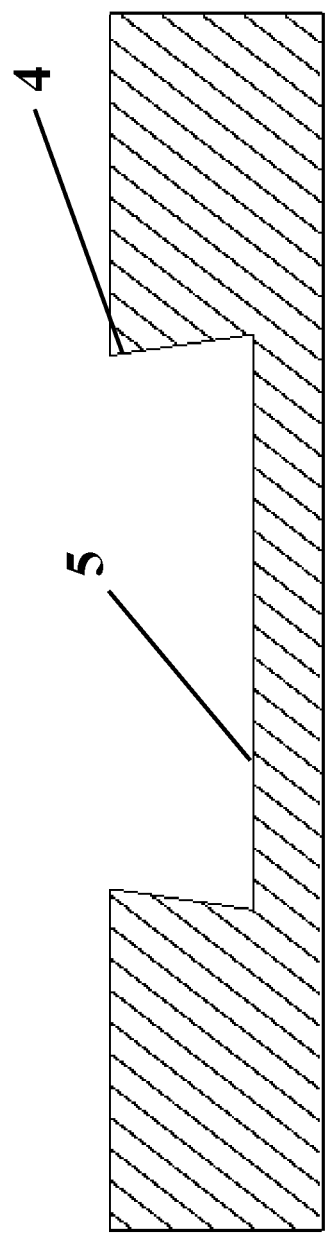
FIG. 3 is a cross-section view of a wafer pocket profile of the flat carrier of the graphite wafer carrier.

With reference to FIGS. 2-3, the wafer pocket profile edge of the flat carrier is a flat and smooth cylindrical surface. When the epitaxial wafer substrate carries on the surface, the substrate directly contacts with bottom of the graphite wafer carrier. During heating in the reaction chamber, the heat is transported from the graphite wafer carrier to the substrate by means of contact. The characteristic of the contact surface between the graphite wafer carrier and the substrate directly decides whether the substrate heating is even. The single wafer pocket profile design of the flat carrier enables direct contact between the epitaxial wafer substrate and the graphite wafer carrier and the heating method is a contact heating. Therefore, the heating evenness of the epitaxial wafer substrate and the epitaxy yield are, to a large extent, influenced by quality and surface condition of the graphite wafer carrier.

Figure 4:
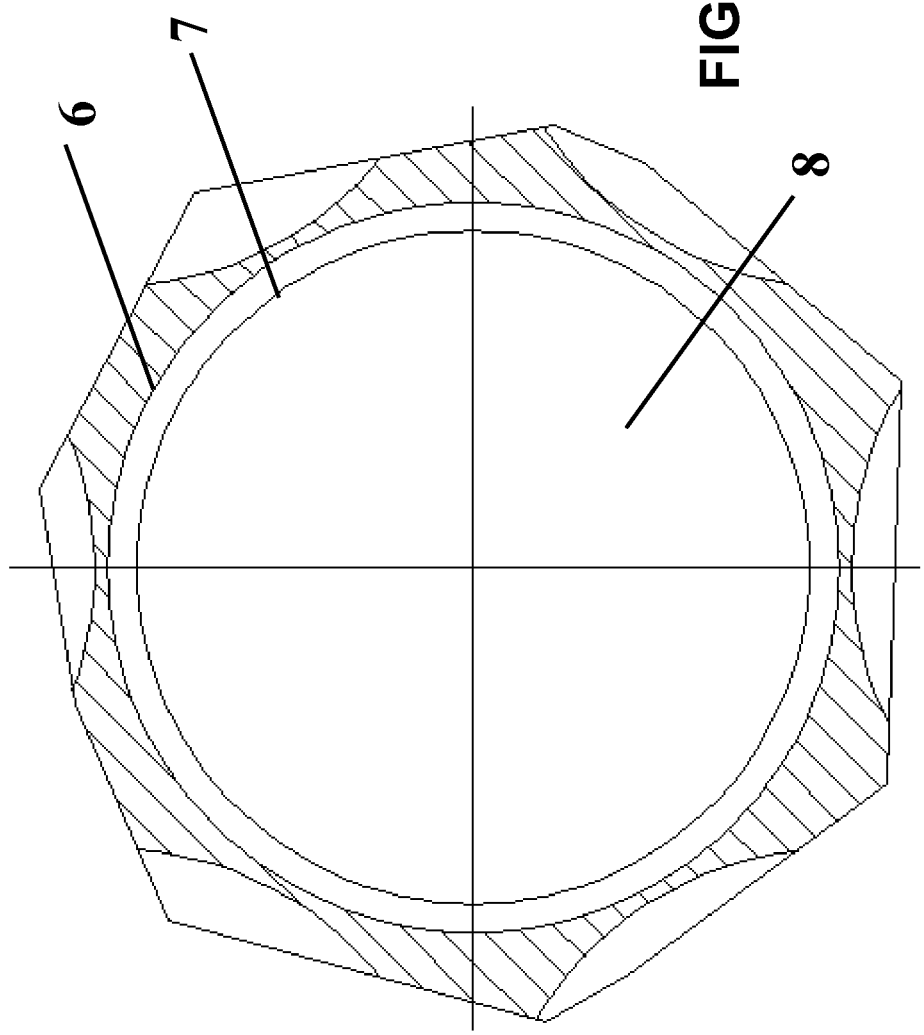
FIG. 4 a section view of a wafer pocket profile of the rim carrier of the graphite wafer carrier.
Figure 5:
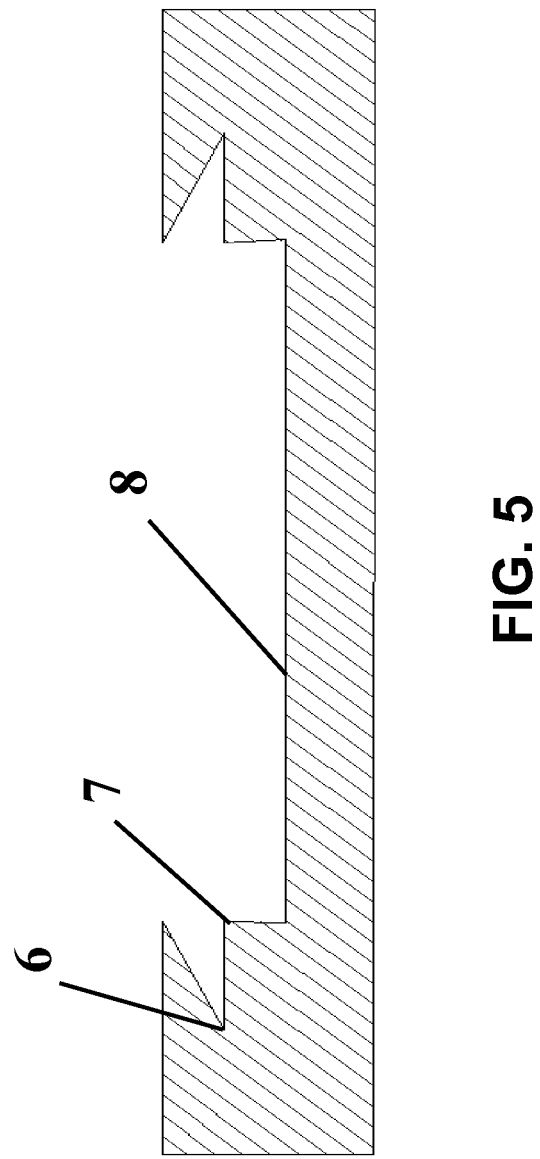
FIG. 5 is a cross-section view of a wafer pocket profile of the rim carrier of the graphite wafer carrier.

With reference to FIGS. 4 and 5, the wafer pocket profile edge of the rim carrier is designed with a round of steps for directly holding up the wafer substrate, thus avoiding direct contact between the wafer substrate and bottom of the wafer pocket profile of the graphite wafer carrier, making the wafer substrate heating as contact heating, which effectively improves the heating evenness of the wafer substrate. However, influenced by the steps of the rim carrier, the contact part of the substrate and the step will be scrapped due to direct contact with the graphite wafer carrier, thus sacrificing a certain portion of chip grains and influencing the chip grain yield.

Figure 6:
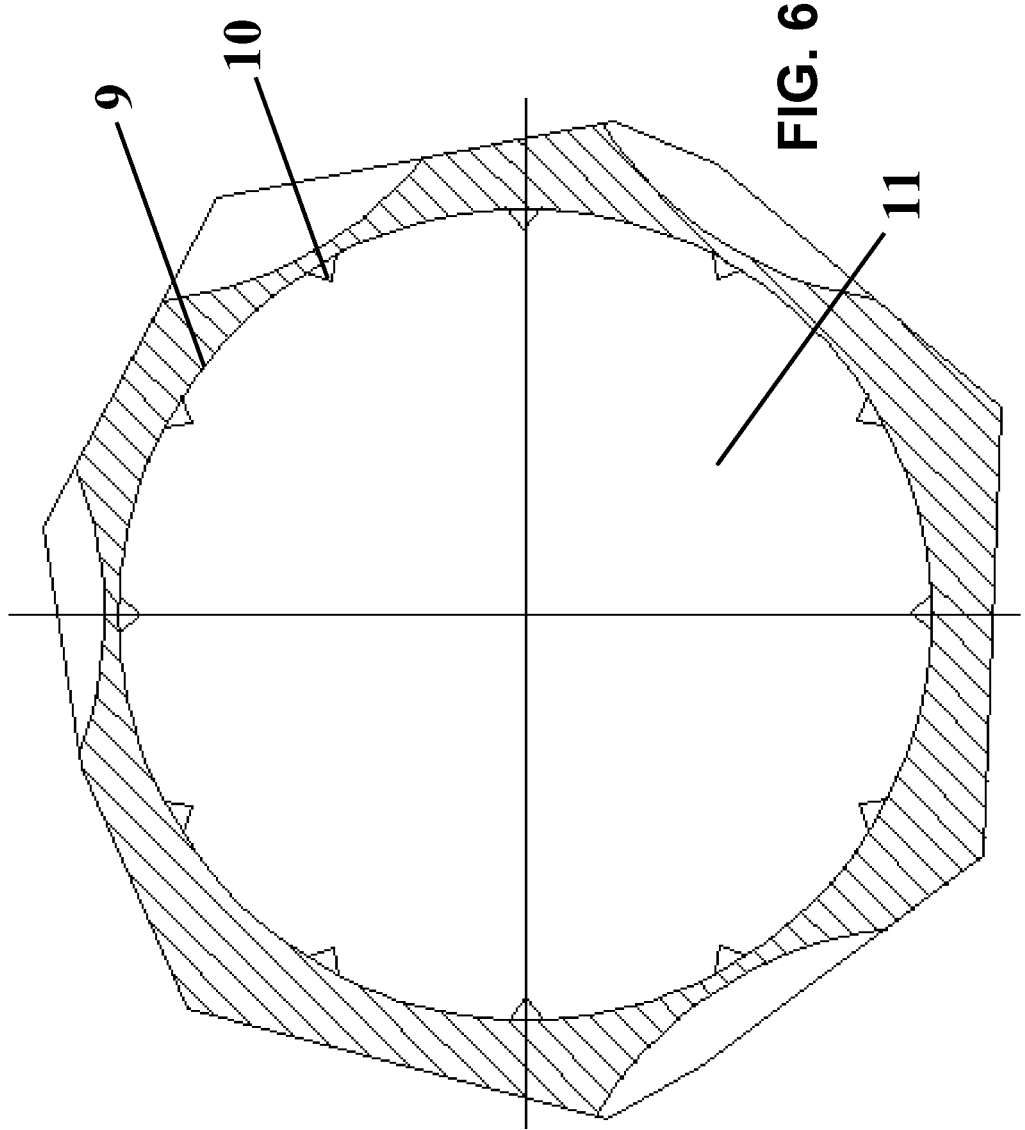
FIG. 6 is a section view of a wafer pocket profile of the tab carrier of the graphite wafer carrier.
Figure 7:
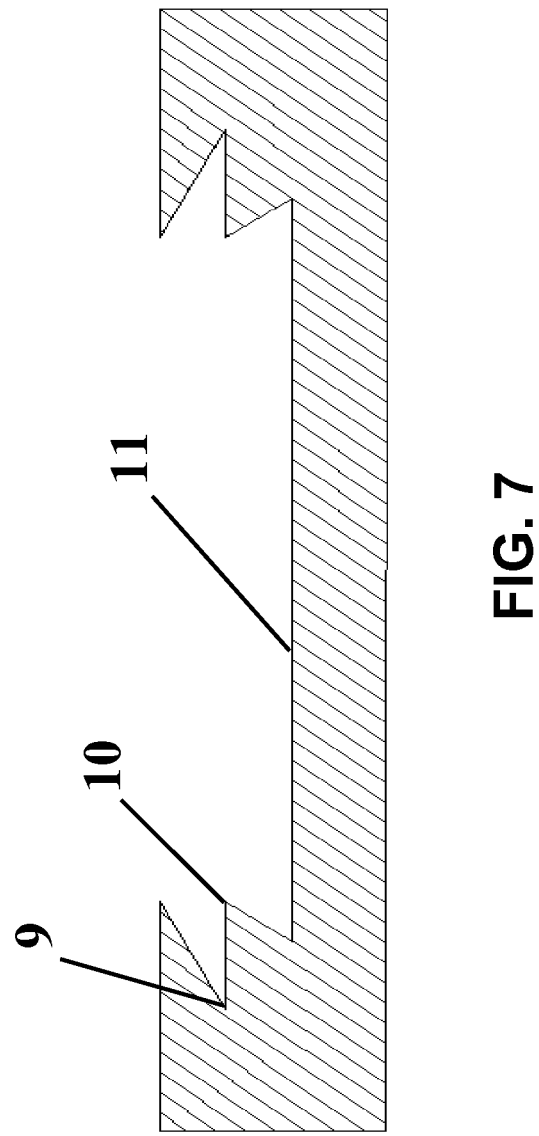
FIG. 7 is a cross-section view of a wafer pocket profile of the tab carrier of the graphite wafer carrier.
Figure 8:
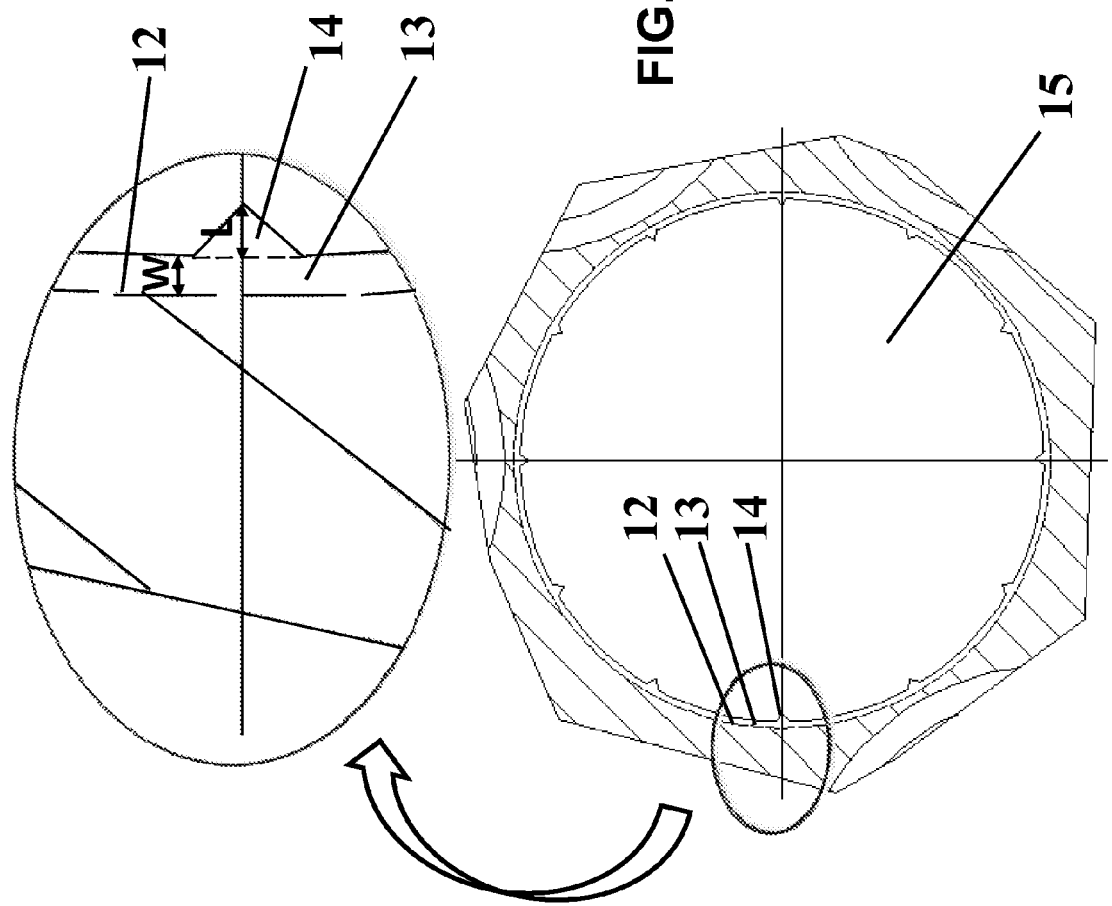
FIG. 8 is a section view of a wafer pocket profile of the gear-ring-shaped rim graphite wafer carrier according to Embodiment 1.
Figure 9:
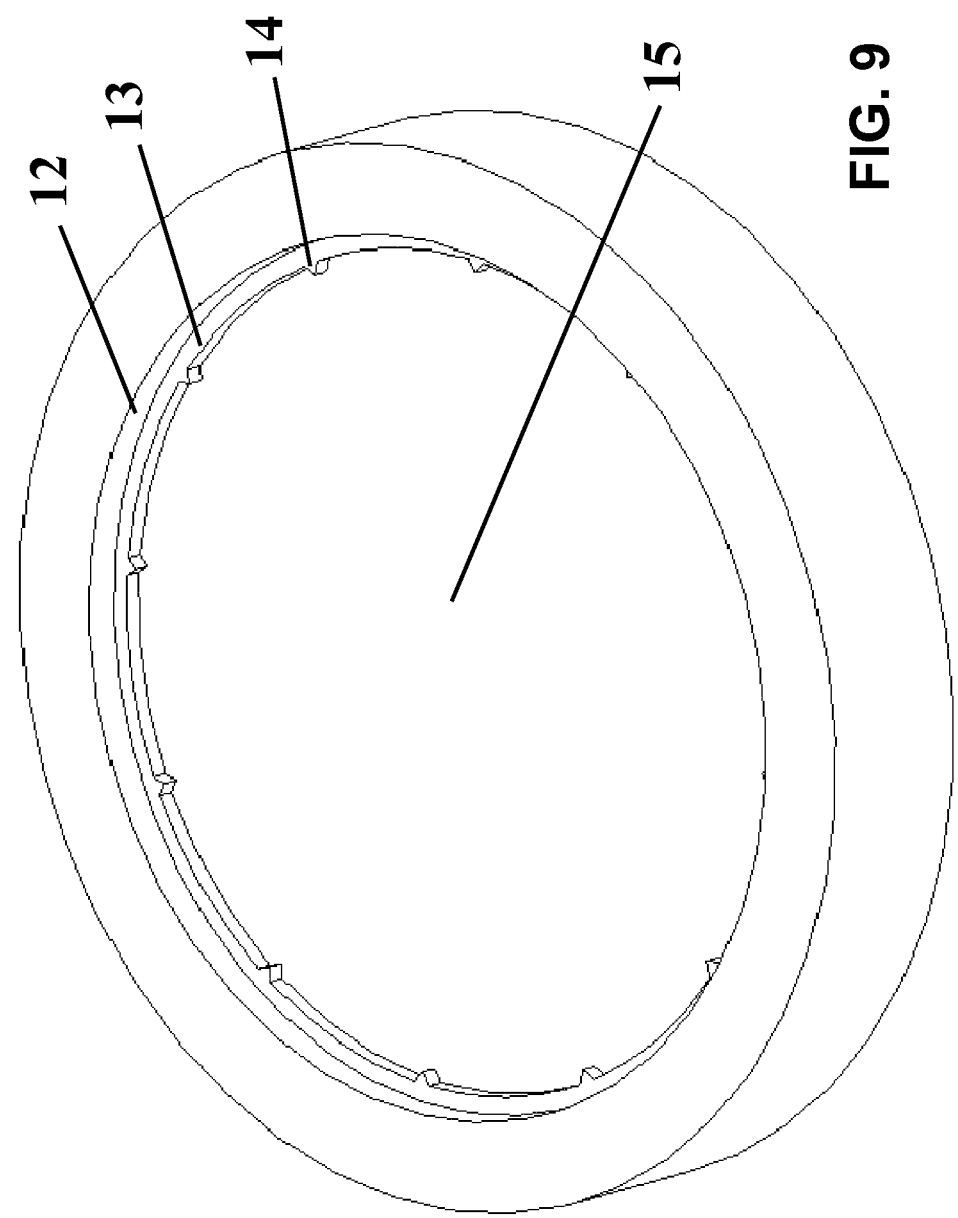
FIG. 9 is a vertical view of a wafer pocket profile of the gear-ring-shaped rim graphite wafer carrier according to Embodiment 1.
Figure 10:
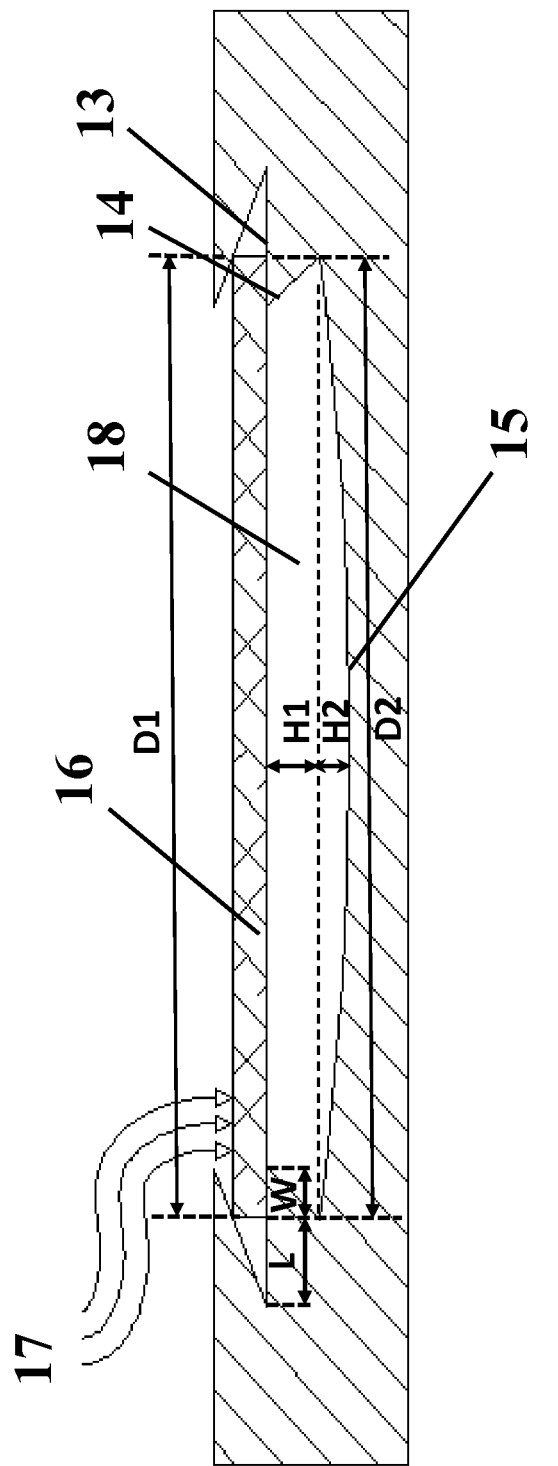
FIG. 10 is a cross-section view of a wafer pocket profile of the gear-ring-shaped rim graphite wafer carrier according to Embodiment 1.

With reference to FIGS. 6 and 7, the wafer pocket profile edge of the tab carrier is designed with a tab carrier in replace of the rim carrier. However, since most part of the substrate edge is exposed to the airflow interference of the reaction chamber, the air will flow into the space between the substrate and the wafer pocket profile of the graphite wafer carrier, causing serious turbulent flow in the bottom of the wafer substrate, which will lead to serious warping of the epitaxial slice and entire low epitaxial wavelength yield.

The three types of graphite wafer carriers may not be desirable in solving epitaxial wavelength and standard deviation yield problems of the LED epitaxial slice. Therefore, how to improve the epitaxy yield and eliminate the influence of the graphite wafer carrier on epitaxy process becomes a big concern for study.

To solve the deficiencies in the aforesaid graphite wafer carrier, the following embodiments propose a graphite wafer carrier with a step-shaped and a protrusion-shaped pocket profile edge design for the LED epitaxial wafer process. The LED epitaxial slice grown from this graphite wafer carrier enjoys entire high yield and good wavelength evenness, thus overcoming defects of unstable distribution wavelength evenness due to low epitaxial slice yield and uneven heating in traditional graphite wafer carriers.

The embodiments disclose a graphite wafer carrier, comprising a plurality of wafer pocket profiles above the carrier for carrying the epitaxial wafer substrate. The inner edge of the wafer pocket profile is a concave step with a plurality of inward-extended support portions. The graphite wafer carrier also comprises a graphite wafer carrier edge and an axle hole at the center of the graphite wafer carrier. The pocket profiles of different quantities and sizes can be arranged on the basis of different process parameters.

Detailed description will be given to specific implementation of the present invention in combination with the embodiments and drawings.

Embodiment 1

With reference to FIG. 1 and FIGS. 8, 9, and 10, a graphite wafer carrier for LED epitaxial wafer processes, comprising: 12 wafer pocket profiles 1, a graphite wafer carrier edge 2 and an axle hole 3 at the center of the graphite wafer carrier, wherein, the wafer pocket profile 1 is arranged above the carrier, for placing the epitaxial wafer substrate 16. The inner edge 12 of the wafer pocket profile 1 has steps 13 and the protrusions 14. The bottom 15 of the wafer pocket profile 1 is a concave surface with concave depth H2 of 5 μm-30 μm. The protrusions 14 are periodically distributed. The step width W of the wafer pocket profile is 0.2 mm, and the height H1 is 0.03 mm. The protrusion width L of the wafer pocket profile is 0.2 mm, and the height H1 is 0.03 mm. The wafer substrate diameter D1 is same with the step inner diameter D2, making the wafer substrate 16 right above the protrusion-shaped edge, i.e., supported by 12 periodically-distributed and inward-extended support portions 14, which avoids scrapping of the periphery portion of the wafer substrate contact with the steps due to over high temperature from direct contact with the graphite wafer carrier and prevents the air from flowing into the space between the substrate and the wafer pocket profile of the graphite wafer carrier, which may cause serious turbulent flow at the bottom of the wafer substrate and serious wrapping of the epitaxial slice.

Embodiment 2

Figure 11:
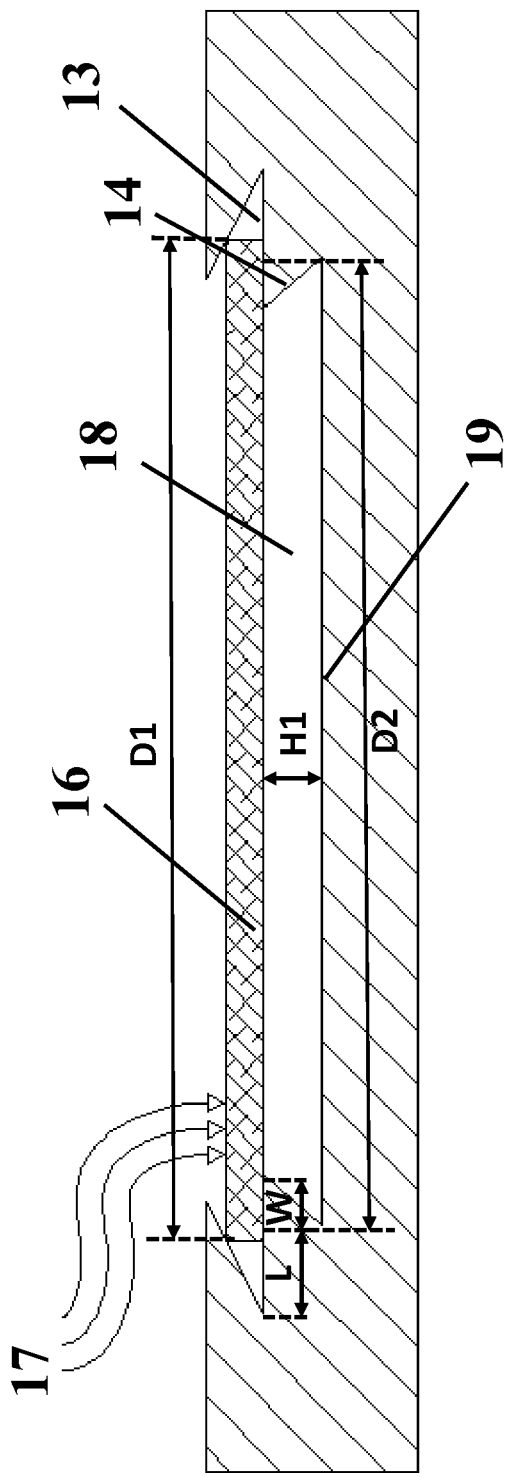
FIG. 11 is a cross-section view of a wafer pocket profile of the gear-ring-shaped rim graphite wafer carrier according to Embodiment 2.

With reference to FIG. 11, the differences from Embodiment 1 may include: in this embodiment, the wafer pocket profile bottom 19 is a flat surface. Wherein, the step 13 width W of the wafer pocket profile is 1.0 mm, and the height H1 is 0.15 mm. The protrusion 14 width W of the wafer pocket profile is 0.4 mm, and the height H1 is 0.15 mm. The wafer substrate diameter D1 is 0.04 mm larger than the step inner diameter D2. 6 periodically-distributed protrusions make most part of the wafer substrate above the protrusion-shaped edge and a small part of the wafer substrate above the step-shaped edge. To effectively support the wafer substrate through the concave step of the inner edge of the wafer pocket profile and the inward-extended support portions and to eliminate contact area between the wafer substrate and the graphite wafer carrier, in comparison to Embodiment 1, the number of protrusions of the wafer pocket profile is reduced to 6, which avoids scrapping of the periphery portion of the wafer substrate contact with the steps due to over high temperature from direct contact with the graphite wafer carrier and prevents the air from flowing into the space between the substrate and the wafer pocket profile of the graphite wafer carrier, which may cause serious turbulent flow at the bottom of the wafer substrate and serious wrapping of the epitaxial slice.

Embodiment 3

Figure 12:
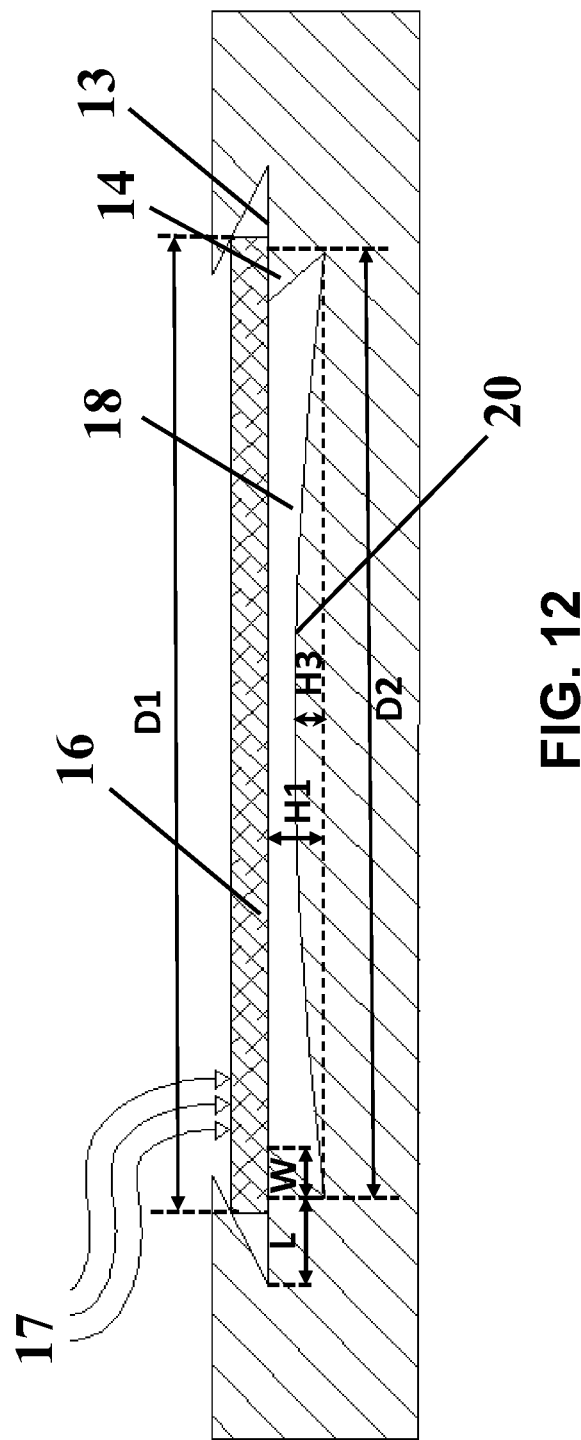
FIG. 12 is a cross-section view of a wafer pocket profile of the gear-ring-shaped rim graphite wafer carrier according to Embodiment 3.

With reference to FIG. 12, the difference from Embodiment 2 lies in that: in this embodiment, the wafer pocket profile bottom 20 is a convex surface, whose convex height H3 is about 5 µm-30 µm. Wherein, the step 13 width W of the wafer pocket profile is 1.5 mm, and the height H1 is 0.5 mm. The protrusion 14 width W of the wafer pocket profile is 0.5 mm, and the height H1 is 0.5 mm. The wafer substrate diameter D1 is 0.05 mm larger than the step inner diameter D2. 4 protrusions are periodically-distributed. In comparison to Embodiment 2, the number of protrusions can be further reduced to 4 since the wafer substrate occupies a larger portion on the concave step of the inner edge of the wafer pocket profile, which avoids scrapping of the periphery portion of the wafer substrate contact with the steps due to over high temperature from direct contact with the graphite wafer carrier and prevents the air from flowing into the space between the substrate and the wafer pocket profile of the graphite wafer carrier, which may cause serious turbulent flow at the bottom of the wafer substrate and serious wrapping of the epitaxial slice.

In the above arrangement with the step-shaped and protrusion-shaped edge, on the one hand, the protrusions 14 of the wafer pocket profile at the edge can directly hold up the epitaxial wafer substrate edge, making the parts of the epitaxial wafer substrate other than those mostly contacted with the protrusions 14 of the wafer pocket profile (in some embodiments, also comprising a small portion of the wafer substrate periphery) hung up on the pocket profile of the graphite wafer carrier. During epitaxial growth, the heat conduction of the epitaxial wafer substrate is changed into thermal radiant heating, thus greatly improving the heating efficiency consistency of the epitaxial wafer substrate in unit area during high temperature heating, which greatly improves wavelength evenness and wavelength yield of the epitaxial slice; on the other hand, the steps 13 of the wafer pocket profile on the epitaxial wafer substrate edge can efficiently prevent the reaction chamber air 17 from flowing into the space 18 between the wafer substrate and wafer pocket profile, which may cause turbulent flow, thus effectively improving epitaxial wavelength evenness and wavelength yield.

The above embodiments disclose a graphite wafer carrier applicable to MOCVD method in the LED epitaxy process. It is determined that with the application of the graphite wafer carrier disclosed in the present invention, during epitaxial growth, the inner edge structure of the wafer pocket profile can eliminate airflow interference and improve the wafer edge yield. Specifically, the epitaxial wavelength evenness and the wavelength yield, in comparison to traditional graphite wafer carrier growth, can be improved by over 10% on average, which greatly improves the epitaxial product yield and is beneficial for reducing production cost of single LED and improving epitaxial quality.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A graphite wafer carrier for LED epitaxy process, wherein the graphite wafer carrier has a plurality of indentations at an upper surface of the carrier configured to carry an epitaxial wafer substrate, wherein an inner edge of the indentations is a concave step with a plurality of inward-extended support portions protruding from the inner edge and having a protrusion width L of a wafer pocket profile underneath the wafer and a step width W of the wafer pocket profile underneath the wafer, wherein W is also a width of an undercut of each of the inward-extended support portions.

2. The graphite wafer carrier of claim 1, wherein the inner edge is configured to reduce airflow interference and improve wafer edge yield during epitaxial growth.

3. The graphite wafer carrier of claim 1, wherein a diameter D1 of the wafer substrate diameter and an inner diameter D2 of the step has a relationship of $0 \leq D1-D2 < 0.06$ mm.

4. The graphite wafer carrier of claim 1, wherein the step has a width of about 0.2 mm-1.5 mm.

5. The graphite wafer carrier of claim 4, wherein: the step width is about 0.2 mm-0.5 mm.

6. The graphite wafer carrier of claim 1, wherein the support portions comprise periodically-distributed protrusions.

7. The graphite wafer carrier of claim 6, wherein: the protrusions have a width of about 0.2 mm-0.5 mm.

8. The graphite wafer carrier of claim 7, wherein the step has a height the same with a height of the protrusions.

9. The graphite wafer carrier of claim 6, wherein the step has a height the same with a height of the protrusions.

10. The graphite wafer carrier of claim 1, wherein the indentations have a bottom that is a flat surface, a convex surface, or a concave surface.

11. A method for an LED epitaxial wafer processes, comprising:
    carrying an epitaxial wafer substrate using a graphite wafer carrier;
    wherein the graphite wafer carrier has a plurality of indentations at an upper surface of the carrier configured to carry the epitaxial wafer substrate;
    wherein an inner edge of the indentations is a concave step with a plurality of inward-extended support portions protruding from the inner edge and having a protrusion width L of a wafer pocket profile underneath the wafer and a step width W of the wafer pocket profile underneath the wafer, wherein W is also a width of an undercut of each of the inward-extended support portions, configured to reduce airflow interference and improve a wafer edge yield.

12. The method of claim 11, wherein a diameter D1 of the wafer substrate diameter and an inner diameter D2 of the step has a relationship of $0 \leq D1-D2 < 0.06$ mm.

13. The method of claim 11, wherein the step has a width of about 0.2 mm-1.5 mm.

14. The method of claim 13, wherein: the step width is about 0.2 mm-0.5 mm.

15. The method of claim 11, wherein the support portions comprise periodically-distributed protrusions.

16. The method of claim 15, wherein the protrusions have a width of about 0.2 mm-0.5 mm.

17. The method of claim 16, wherein the step has a height the same with a height of the protrusions.

18. The method of claim 15, wherein the step has a height the same with a height of the protrusions.

19. The method of claim 11, wherein the indentations have a bottom that is a flat surface, a convex surface, or a concave surface.

20. An MOCVD system comprising one or more graphite wafer carriers for LED epitaxial processing, wherein the graphite wafer carrier has a plurality of indentations at an upper surface of the carrier configured to carry an epitaxial wafer substrate, wherein an inner edge of the indentations is a concave step with a plurality of inward-extended support portions protruding from the inner edge and having a protrusion width L of a wafer pocket profile underneath the wafer and a step width W of the wafer pocket profile underneath the wafer, wherein W is also a width of an undercut of each of the inward-extended support portions.

\* \* \* \* \*